Figure 1:
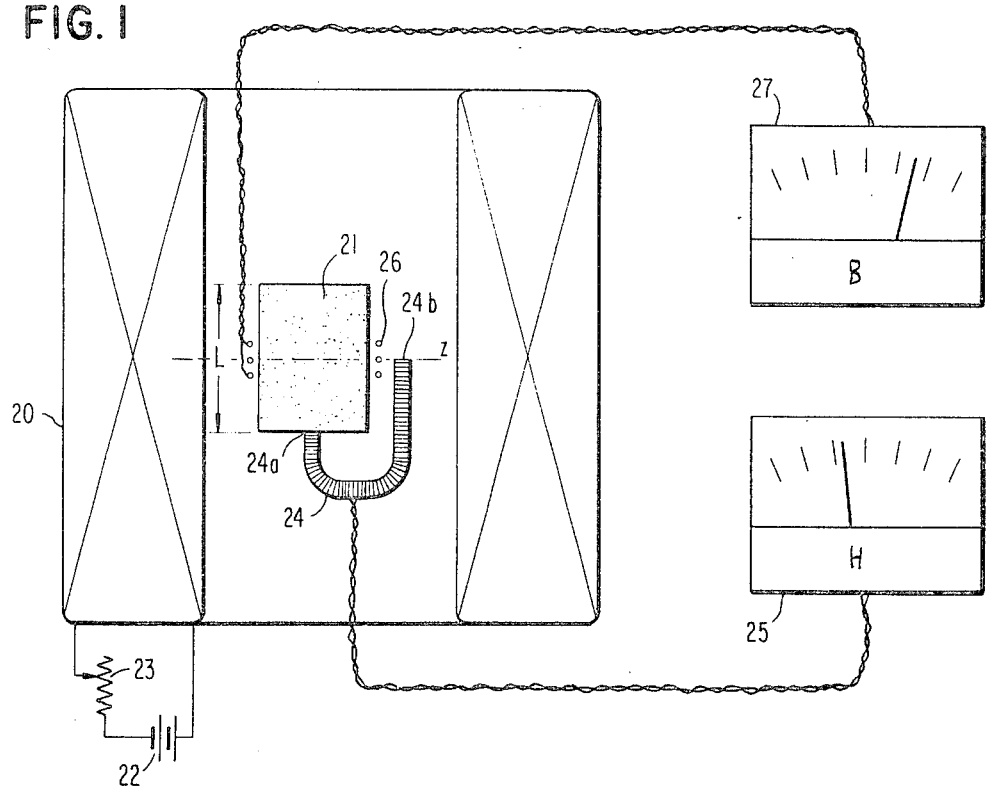

United States Patent [19]

Steingroever

[11] 3,976,935

[45] Aug. 24, 1976

[54] APPARATUS FOR MEASURING THE INTERNAL FIELD INTENSITY OF MAGNET BODIES

[75] Inventor: Erich Steingroever, Bonn, Germany

[73] Assignee: Elektro-Physik, Hans Nix & Dr.-Ing. E. Steingroever KG, Cologne, Germany

[22] Filed: Apr. 30, 1975

[21] Appl. No.: 573,132

Related U.S. Application Data

[62] Division of Ser. No. 414,324, Nov. 29, 1973, Pat. No. 3,925,724.

[30] Foreign Application Priority Data

June 6, 1973 Germany............................ 2328690

[52] U.S. Cl............................. 324/34 R; 324/43 R
[51] Int. Cl.²......................................... G01R 33/14
[58] Field of Search........... 324/34 R, 42, 40, 43 R, 324/47

[56] References Cited
UNITED STATES PATENTS

| | | | |
|---|---|---|---|
| 1,204,489 | 11/1916 | Rogowski.......................... | 324/34 R |
| 2,861,241 | 11/1958 | Leonard et al. ..................... | 324/40 |
| 3,365,660 | 1/1968 | Steingroever..................... | 324/34 R |
| R19,600 | 6/1935 | Hermann............................. | 324/40 |

FOREIGN PATENTS OR APPLICATIONS 1,104,777  11/1955  France............................... 324/34 R

OTHER PUBLICATIONS

Margerison et al.; Some Uses of the Magnetic Potentiometer etc., Jour. of Scien. Inst., Aug., 1946, pp. 182–184.

Magnetik Elektro–Physik Publication; 1972, pp. 14, 15, 19 & 20.

*Primary Examiner*—Robert J. Corcoran
*Attorney, Agent, or Firm*—George H. Mitchell, Jr.

[57] ABSTRACT

Apparatus for measuring the internal field intensity H of a magnetic body having opposite poles surfaces includes an elongated magnetic potential measuring coil, one end of which is placed in contact with one of the pole surfaces of the body being measured, while the body is subjected to a magnetic field of variable intensity generated by an iron-free coil having lines of force passing through the body in directions perpendicular to the pole surfaces of the body being measured, the other end of the measuring coil being placed at a location which is uninfluenced by the magnetic potential at either of the poles of the body in one example and, in another example, being placed in contact with the other pole surface of the body. Values for B may also be measured by a second coil at the same time.

6 Claims, 2 Drawing Figures

U.S. Patent   Aug. 24, 1976   3,976,935

APPARATUS FOR MEASURING THE INTERNAL FIELD INTENSITY OF MAGNET BODIES

This application is a division of copending application Serial No. 414,324, filed November 29, 1973 for Apparatus for Measuring the Hysteresis Curve of Magnetic Bodies now U.S. Pat. No. 3,925,724.

The present invention relates to apparatus for the measurement of magnetic characteristics of materials and more particularly to the measurement of the hysteresis curves of magnetic materials, including the obtaining of accurate values of internal field strength H.

As is well known, the magnetic properties of materials are represented by the hysteresis curve, which is also called the curve of magnetization. This curve shows values of induction B, or magnetization B-H, as a function of field strength H in the magnetic material.

Measurement of induction B has been obtained in the past, either by using a coil encircling the sample body, or by means of a coil completely embedded in one of the soft iron pole pieces of an electromagnetic measuring yoke. Such an arrangement is described in a paper entitled "Some Measurements of Inhomogeneous Permanent Magnets by the Pole-Coil Method" by E. Steingroever, published in Special Technical Publication 526 of American Society for Testing and Materials, pages 43–47 (1973).

However, up to this point it has not been possible to measure the field strength H inside the sample body. It has been customary to make a measurement of H adjacent the sample and make an assumption that the internal value is the same as the measured value, or to obtain a value by extrapolation such as described in the German Industrial Standard published as DIN 50 470, 1964, Section 8.3. These assumptions are inexact, particularly in the case of highly magnetically coercive materials, or if the induction is sufficiently high that there is magnetic saturation of the soft iron poles of the measuring yoke.

Therefore, one object of the present invention is to provide apparatus which is capable of directly measuring the internal magnetic field strength H of a magnetic body while it is subjected to the magnetic field generated by an iron-free coil which could be superconducting.

This is accomplished by utilizing an elongated potential coil, with one end of the potential coil being in contact with one face of the sample body being measured in the yoke, the other end of the potential coil being disposed at a remote location at which the magnetic potential is substantially constant; what otherwise might be called a "field-free" space. The other end of the potential coil may also be placed in contact with the other face of the sample body.

Figure 2:
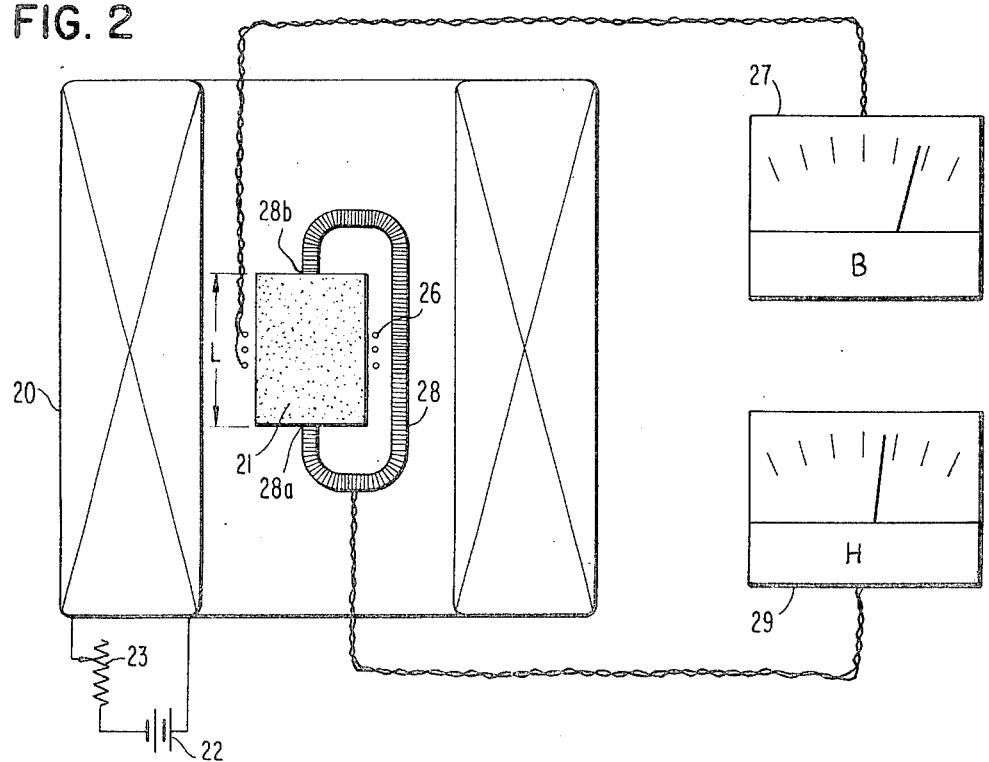

In the drawings, FIG. 1 is a schematic view of a preferred form of apparatus according to the present invention, and FIG. 2 is a schematic view of a modified form of the invention.

While the employment of a measuring yoke having iron pole pieces, as disclosed and claimed in application Ser. No. 414,324, is quite satisfactory for the production of field intensities of normal values but these yokes are impractical when it is desired to produce field intensities in excess of 30KA/cm. Therefore, FIG. 1 discloses a further example of the invention by means of which measurements of internal field H can be made with much greater external field intensities in excess of 100KA/cm and more.

In FIG. 1, the apparatus consists of a cylindrical coreless coil 20 which completely surrounds the sample body 21 of magnetic material and extends at both ends beyond the planes of the opposing parallel pole surfaces of the sample. Coil 20 may be of the superconducting cryogenic type and may be energized from a D.C. source, such as the battery 22, under the control of a variable resistance 23. The sample 21 is positioned in the center of the coil 20 so as to be located in the homogeneous field of the coil, with the lines of force passing through in a direction perpendicular to the opposing pole surfaces.

In this instance, a generally J-shaped potential coil 24 is disposed with one end 24a, in contact with one pole surface of the sample body while the other end 24b is disposed at a remote location, such as in the plane of the neutral zone z of the body having a constant magnetic potential with respect to the sample body.

The potential coil 24 is essentially an elongated coil having a constant value of $n.F/l$, where $n$ is the number of turns of winding, F is the cross-sectional area of the winding and $l$ is the length of the coil. Thus it is a coil having constant winding area density and may be formed on an elongated rod having a uniform cross-section with constant density of winding $n.F/l$. If a coil of this type is connected to a magnetic fluxmeter, the fluxmeter provides immediate indications of the changes in differences between the magnetic potentials at the opposite ends of the potential coil. Also, if one end of the coil is maintained at a location where the magnetic potential is constant, such as in the neutral zone z, the fluxmeter will record any change in magnetic potential at the other end of the coil.

Thus, the fluxmeter 25 provides a measurement of the difference in magnetic potential at points 24a and 24b, which is proportional to the product of internal field strength H and one half the length (L/2) of the sample body. The desired value of H is readily obtained by dividing the measured potential difference H·L/2 by L/2; this can be realized by adjusting the sensitivity of fluxmeter 25 accordingly to the length L of the sample. As in the previous examples, the potential coil 24 may be connected with fluxmeter 25. By calibrating the fluxmeter reciprocally to one half the length (L/2) of the sample body, direct readings of the values of the internal field H can be obtained. In addition, the induction B may also be measured in a known way by means of a coil 26 which encircles the body 21 and is connected to fluxmeter 27.

The modification shown in FIG. 2 also discloses a system in which the coil 20 is used to generate a high intensity external field for testing a sample body 21. In this case, the potential coil 28 may be generally C-shaped, so that one end 28a is in contact with one pole surface of the sample body and the other remote end 28b, is in contact with the other pole surface. Potential coil 28 is connected with fluxmeter 29 but, in this case, it is calibrated reciprocally to the full length L of the sample body. As before, the induction B can be measured by means of the encircling coil 26 connected to a fluxmeter 27.

The potential coil of the present invention can be used in the measurement of both the so-called "hard" and "soft" magnetic materials and is also useful for the measurement of the saturation magnetization or coercive field strength of materials.

What is claimed is:

1. In apparatus for measuring the internal field intensity H of a sample body of magnetic material having opposite pole surfaces extending in parallel planes by subjecting a sample body to a magnetic field of variable intensity having lines of force passing through said sample body in directions perpendicular to said parallel planes, the improvement which comprises an elongated magnetic potential measuring coil means having a non-magnetic core and a uniform winding area density along its length, one end of said measuring coil means being disposed in contact with one of the pole surfaces of said body, while being subjected to said magnetic field; the other end of the measuring coil means being disposed between said parallel planes of the opposite pole surface in a zone having a neutral magnetic potential with respect to the opposite pole surfaces of the sample body, and a fluxmeter connected with said coil means, said means for generating said magnetic field of variable intensity comprising an iron-free coil surrounding said sample body and said magnetic potential measuring coil means.

2. The invention defined in claim 1, wherein said iron-free coil is superconducting.

3. In apparatus for measuring the internal field intensity H of a sample body of magnetic material having opposite pole surfaces extending in parallel planes by subjecting a sample body to a magnetic field of variable intensity having lines of force passing through said sample body in directions perpendicular to said parallel planes, the improvement which comprises an elongated magnetic potential measuring coil means having a non-magnetic core and a uniform winding area density along its length, one end of said measuring coil means being disposed in contact with one of the pole surfaces of said body, while being subjected to said magnetic field; the other end of the measuring coil means being disposed in contact with the other of the pole surfaces of said body while being subjected to said magnetic field, and a fluxmeter connected with said measuring coil means, and means for generating a magnetic field of variable intensity comprising an iron-free coil surrounding said sample body.

4. The invention defined in claim 3, wherein said iron-free coil also surrounds said magnetic potential measuring coil means.

5. The invention defined in claim 3, wherein said iron-free coil is superconducting.

6. The invention defined in claim 5, wherein said superconducting coil also surrounds said magnetic potential measuring coil means.

* * * * *